United States Patent
Weldon et al.

(10) Patent No.: US 9,182,455 B2
(45) Date of Patent: Nov. 10, 2015

(54) DLA ROTOR FLUX DENSITY SCAN METHOD AND TOOL

(71) Applicant: Continental Automotive Systems, Inc., Auburn Hills, MI (US)

(72) Inventors: Craig Andrew Weldon, Chatham (CA); Raymond Rasokas, Thamesville (CA)

(73) Assignee: Continental Automotive Systems, Inc., Auburn Hills, MI (US)

( * ) Notice: Subject to any disclaimer, the term of this patent is extended or adjusted under 35 U.S.C. 154(b) by 210 days.

(21) Appl. No.: 13/710,560

(22) Filed: Dec. 11, 2012

(65) Prior Publication Data

US 2013/0162244 A1    Jun. 27, 2013

Related U.S. Application Data

(60) Provisional application No. 61/579,211, filed on Dec. 22, 2011.

(51) Int. Cl.
*G01B 7/30* (2006.01)
*G01R 33/038* (2006.01)
*G01R 31/34* (2006.01)
*G01R 33/00* (2006.01)

(52) U.S. Cl.
CPC ............... *G01R 33/038* (2013.01); *G01B 7/30* (2013.01); *G01R 31/34* (2013.01); *G01R 33/0035* (2013.01)

(58) Field of Classification Search
CPC ............ G01B 7/30; G01B 7/31; G01B 7/305; G01B 7/315; G01R 33/038; G01R 31/34; G01R 33/0035
USPC ..................... 324/66–67, 160–180, 71.1–157, 324/425–470, 200–263, 750.01–764.01; 702/1–199; 73/1.01–36
See application file for complete search history.

(56) References Cited

U.S. PATENT DOCUMENTS

| 2004/0015326 A1* | 1/2004 | Bluestein ....................... 702/155 |
| 2004/0212392 A1* | 10/2004 | Hauser et al. ................. 324/772 |
| 2011/0089879 A1 | 4/2011 | Duits |

FOREIGN PATENT DOCUMENTS

| DE | 102005029368 A1 | 12/2006 |
| JP | 57156653 A | 9/1982 |

OTHER PUBLICATIONS

Jon Peltier, Spider Chart Alternatives, Oct. 3, 2008, Peltier Tech Blog.*
PCT International Preliminary Report on Patentability.
JP 57156653 English Abstract.
DE 10 2005 029368 English Abstract.

* cited by examiner

*Primary Examiner* — Son Le

(57) ABSTRACT

A method of measuring flux density and run out to accommodate rotors of different diameters, evaluate intrinsic properties of magnet material and the magnetization process. Circular run out measurement capability is also used to evaluate bearing journal "ovality." The method includes the use of a scan tool, or a DLA Rotor Flux Density Scan Fixture, which evaluates the electromagnetic field strength (gauss), combined with surface run out and presents the data in a scalable pictorial format. The scan tool includes a probe which measures a magnetic field strength and circular run out of the perimeter of the magnet. Simultaneously, a non-contact measurement sensor is used to measure the rotor surface for subtle variations. The resulting sine wave gauss data and the surface dimension data are manipulated into a scalable "radar" plot. The radar plot correlates magnetic pole field strength and surface circular run out variation to the index position.

13 Claims, 7 Drawing Sheets

DLA ROTOR FLUX DENSITY SCAN METHOD AND TOOL

CROSS-REFERENCE TO RELATED APPLICATIONS

This application claims the benefit of U.S. Provisional Application No. 61/579,211 filed Dec. 22, 2011. The disclosure of the above application is incorporated herein by reference.

FIELD OF THE INVENTION

The invention relates generally to permanent magnet stepper motors and digital linear actuators, and more particularly, to the calibration of the axial magnetization of a cylindrical magnet used in stepper motors and digital linear actuators during development.

BACKGROUND OF THE INVENTION

Digital linear actuators (DLAs) and stepper motors typically incorporate a rotor in the form of a magnetic cylinder. During calibration of the rotor, the flux density is measured (in Gauss), to determine the capacity of the rotor. Typical methods used to determine the flux density involve spinning the rotor at a predetermined high velocity (such as 1800 rpm), in a generated voltage fixture device required for screw-in family rotors. A separate tool is required for other types of rotors. These are only applicable for measuring flux density during the production process because the fixture is not suitable to fit nonproduction stepper motor rotors, or rotors which have bearings attached.

Another diagnostic method involves spinning the rotor assembly at high velocity, such as 1800 rpm, while assembled within the DLA. This method is an intrusive test method and degrades functionality of the DLA. The rotational speed required to develop generated voltage from the motor is sufficient to predicate degradation of internal bearings or lubricants. Insertion of the threaded shaft adaptor may damage the internal lead screw thread. The flux density in millitesla (mT) is plotted as a sine wave as shown in FIG. 1. While the plot shown in FIG. 1 shows the different flux density measurements, the plot in FIG. 1 is difficult to interpret, and provides no correlation between the flux density, and variations in the dimensions of the rotor.

Therefore, there exists a need for a method of measuring the flux density of a rotor used for a DLA or stepper motor during the development stages, which measures not only flux density, but also is capable of measuring surface irregularities of the rotor.

SUMMARY OF THE INVENTION

The present invention is a method for measuring the flux density and run out of a rotor used as part of a digital linear actuator (DLA).

The method of measuring flux density and run out according to the present invention has flexibility to accommodate rotors of different diameters, evaluate intrinsic properties of magnet material and the magnetization process. Circular run out measurement capability is also used to evaluate bearing journal "ovality." The method includes the use of a scan tool, or a DLA Rotor Flux Density Scan Fixture, which evaluates the electromagnetic field strength (gauss) combined with surface run out and presents the data in a scalable pictorial format. The cylindrical rotor magnet is affixed in the scan tool, and the scan tool simultaneously measures magnetic field strength and circular run out of the perimeter or outer surface of the magnet. In this embodiment, the scan tool includes a fixture, such as a taper press fit mandrel of appropriate size, and the rotor is mounted in the mandrel. The mandrel is nonintrusive and does not damage the internal features of the rotor.

A rotary encoder provides the scalar reference for all measured values. The magnetic field strength (gauss) is measured at a distance from the outer surface of the rotor, defined as a radial "air-gap." Simultaneously, a laser is used to measure the rotor surface for subtle variation. The resulting sine wave gauss data and the surface radial dimension data are manipulated into a scalable "radar" plot. The radar plot correlates magnetic pole field strength and surface circular run out variation to the index position. Two planar positions are evaluated to correlate front and rear coils typically found in can stack stepper motors. The DLA Rotor Flux Density Scan Fixture is adaptable and accommodates equivalent size DLA rotors for benchmarking purposes. The DLA Rotor Flux Density Scan Fixture may determine bearing journal surface run out or "ovality" in conjunction with the rotor magnetic and run out properties.

In one embodiment, the present invention is a method for measuring the magnetic flux and run out of a surface, comprising the steps of providing a digital linear actuator (DLA), and providing a rotor, the rotor being part of the DLA. The method also includes providing a magnet connected to and circumscribing the rotor, the magnet having an outer surface, providing a non-contact measurement sensor for measuring the run out on the outer surface of the magnet, and providing a gauss probe for measuring the magnet flux density on the outer surface of the magnet. The run out and the magnet flux density are simultaneously measured, and plotted on a plot or graph to correlate the measurements of the run out and the magnet flux density.

A tool, such as a scan tool, is provided for measuring the magnetic flux and the run out, the gauss probe and the non-contact measurement sensor being part of the tool. The tool includes an indexing rotary head, a shaft connected to and driven by the indexing rotary head, and a fixture connected to the shaft. Also connected to the indexing rotary head is an angular encoder for measuring the rotational position of the shaft. The rotor is mounted in the fixture, and the indexing rotary head is rotated such that rotational force is transferred through the shaft and the fixture, rotating the rotor in the fixture. As the rotor is rotated, the flux density of the rotor is measured using the gauss probe, the run out of the rotor is measured using the non-contact measurement sensor, and the total amount of rotation of the shaft is measured by the angular encoder.

The run out is measured in two locations on the magnet. More specifically, the run out is measured on a first section and a second section. The first section is a first central median bisecting plane on the outer surface, and is located in proximity to an end of the magnet. The second section is a second central median bisecting plane on the outer surface, but is located in proximity to the opposite end of the magnet as the first section. In one embodiment, the plot is a radar plot having a first flux density plot, indicating the magnetic flux density measured from the first section, and a first run out plot, indicating the run out measured from the first section. The plot also includes a second flux density plot, indicating the magnetic flux density measured from the second section, and a second run out plot, indicating the run out measured from the second section. The first run out plot and the second run out plot are plotted with the first flux density plot and the second flux density plot, such that a correlation is made between variations in run out and flux density measurements.

The radar plot includes a plurality of petals, each of the plurality of petals includes a portion of the first flux density plot and a portion of the second flux density plot. A portion of the plurality of petals represents one or more north poles, and another portion of the plurality of petals represents one or more south poles. The first run out plot and the second run out plot are plotted on the radar plot to provide a correlation between the run out and the flux density of the one or more north poles and the one or more south poles.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
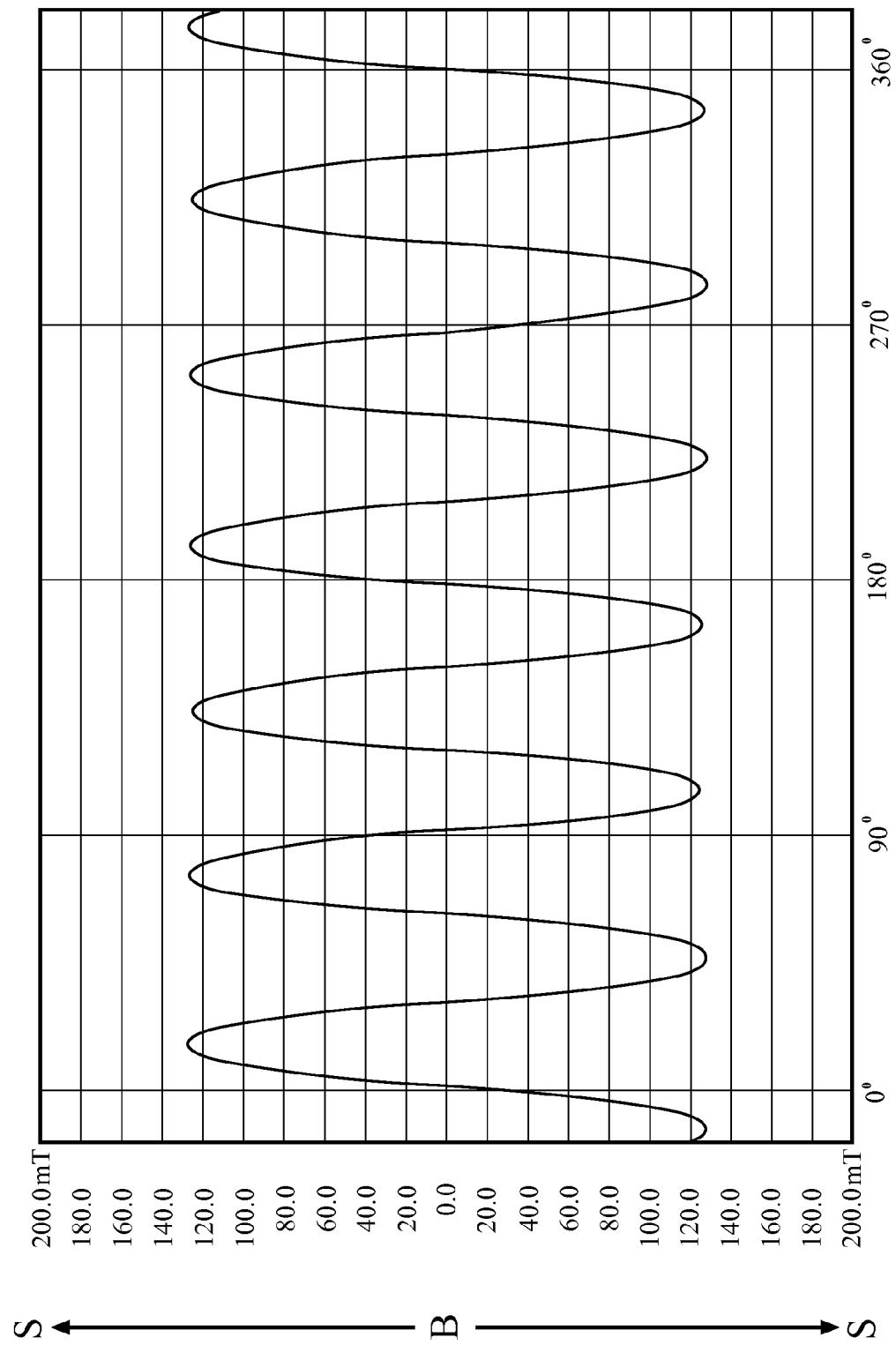
FIG. 1 is a plot having the flux density measurements of a rotor, according to prior art.

The following description of the preferred embodiment(s) is merely exemplary in nature and is in no way intended to limit the invention, its application, or uses.

Referring to FIGS. 2A-6 generally, and with specific reference to FIGS. 2A-3B, and digital linear actuator (DLA) incorporating the method of the present invention is shown generally at 10. The DLA 10 includes a housing 12 connected to a connector 14. The connector 14 includes a groove 16 which has an O-ring 18 for providing a sealed connection between the housing 12 and the connector 14.

The connector 14 also includes a set of terminals 20 which are connected to a set of wires 22. At least one of the wires 22 is in electrical communication with a first coil 24, and at least another of the wires 22 is in electrical communication with a second coil 26. The first coil 24 is located in a first stator assembly 28, and the second coil 26 is located in a second stator assembly 30. Connected to the first stator assembly 28 is an inner housing 32, and the inner housing 32 partially surrounds a first end, shown generally at 34, of a rotor, generally shown at 36. The first end 34 also has a bearing surface 38 which is supported by a bearing 40. There is also a bearing locator 42 connected to the inner housing 32, best seen in FIG. 2A, which is also used for correctly locating the bearing 40.

Figure 2A:
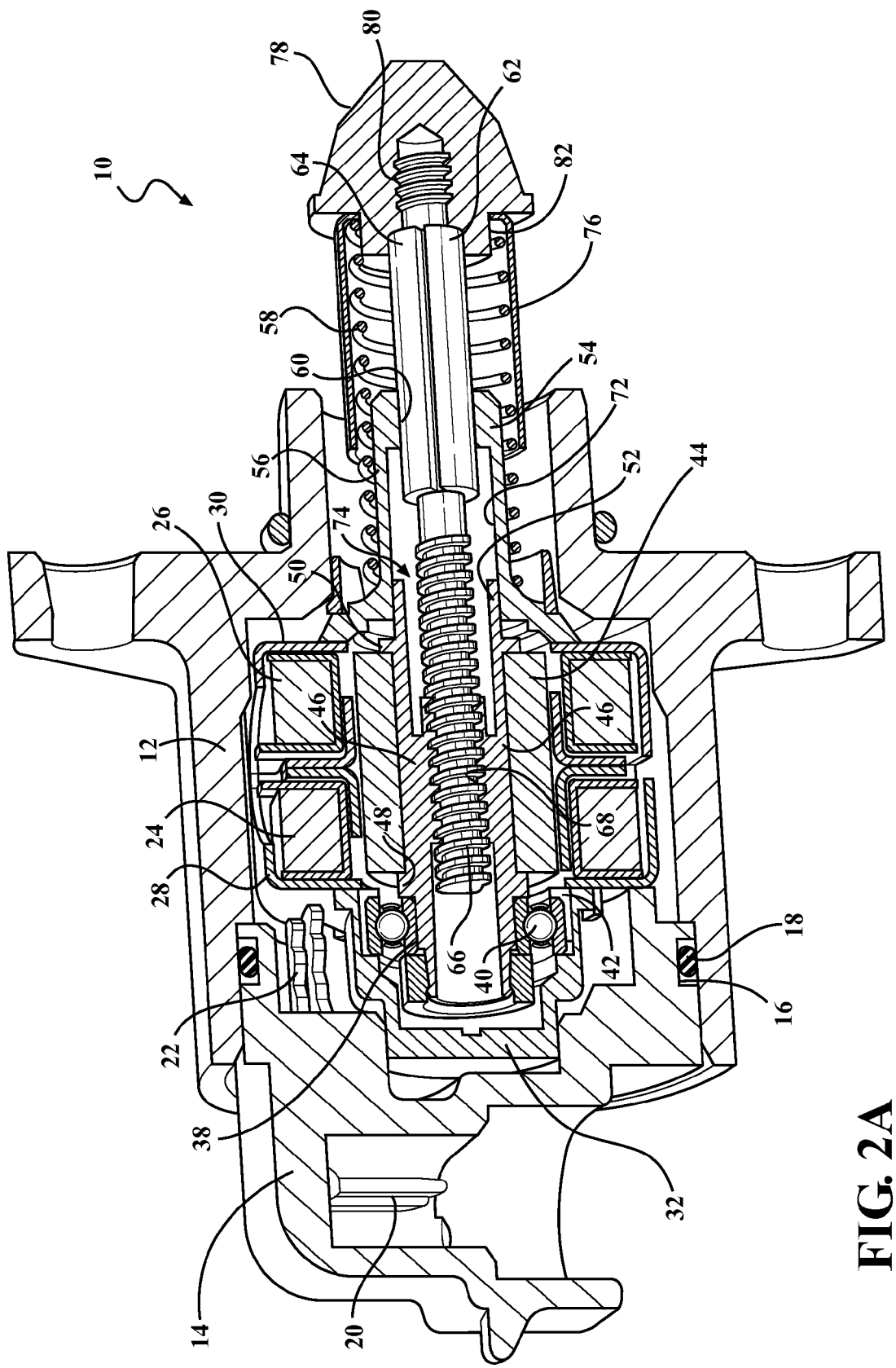
FIG. 2A is a sectional side view of a digital linear actuator having a rotor which includes a magnet, and the flux density and run out of the magnet are measured according to the present invention.
Figure 2B:
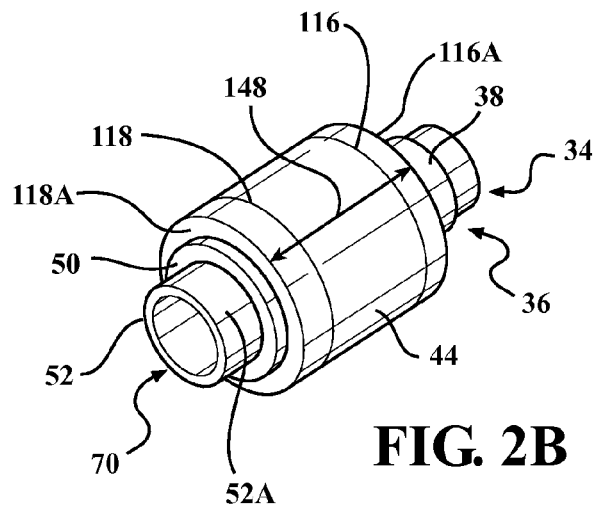
FIG. 2B is a perspective view of a rotor having a magnet, and the flux density and run out of the magnet are measured according to the present invention.

The rotor 36 from the DLA 10 is a magnetic cylinder. More specifically, the rotor 36 also includes a cylindrical magnet 44 mounted on a body portion 46 of the rotor 36. The body portion 46 also include two flanges 48,50. The magnet 44 is mounted to the body portion 46 between the two flanges 48,50. Protruding from the flange 50 is an outer portion 52, which partially extends into a front bearing housing 54. The front bearing housing 54 is connected to the second stator assembly 30, as shown in FIG. 2A, and has an elongated portion 56 which is at least partially surrounded by a spring 58. The outer portion 52 is part of the second end 70 of the rotor 36, and extends into and contacts an inner surface 72 of an inner cavity, shown generally at 74, of the elongated portion 56. The elongated portion 56 also has a guide aperture 60 which guides an enlarged diameter portion 64 of an actuation shaft 62, and the guide aperture 60 prevents the shaft 62 from rotating, the function of which will be described later. The actuation shaft 62 also includes a threaded portion 66 which is engaged with a threaded portion 68 formed as part of the body portion 46 of the rotor 36.

The spring 58 extends away from the front bearing housing 54 and is partially surrounded by a sleeve 76. The sleeve 76 is connected to a first portion 78 of a valve. The first portion 78 is mounted on the end of the actuation shaft 62 through the use of a threaded connection 80. The first portion 78 of the valve also includes an extension 82 which is surrounded by the spring 58, the extension also functions as a guide for the spring 58.

The spring 58 functions to bias the valve toward a closed position. The spring 58 also functions to limit axial play in the bearing 40, limit backlash between the threaded portions 66,68, and provide dynamic force balance during the travel of the actuation shaft 62. The valve, and more specifically the first portion 78, is moved through the use of the rotor 36 and the stator assemblies 28,30. The first stator assembly 28 includes a plurality of field cup teeth and pole plate teeth. Shown in the Figures are a first outer half field cup tooth 84, a second outer half field cup tooth 86, and a third outer half field cup tooth 88 of the first stator assembly 28, as well as a first inner half pole plate tooth 90, and a second inner half pole plate tooth 92. Also shown in the Figures are a first inner half pole plate tooth 94, a second inner half pole plate tooth 96, and a third inner half pole plate tooth 98 of the second stator assembly 30, as well as a first outer half field cup tooth 100, and a second outer half field cup tooth 102 of the second stator assembly 30. While each of the stator assemblies 28,30 are shown having the various pole plate teeth and field cup teeth, the stator assemblies 28,30 must have an equal number of teeth to create an equal number of north-south pairs to function properly. It is within the scope of the invention that more or less pole plate teeth and field cup teeth may be used, depending upon the application.

Figure 3A:
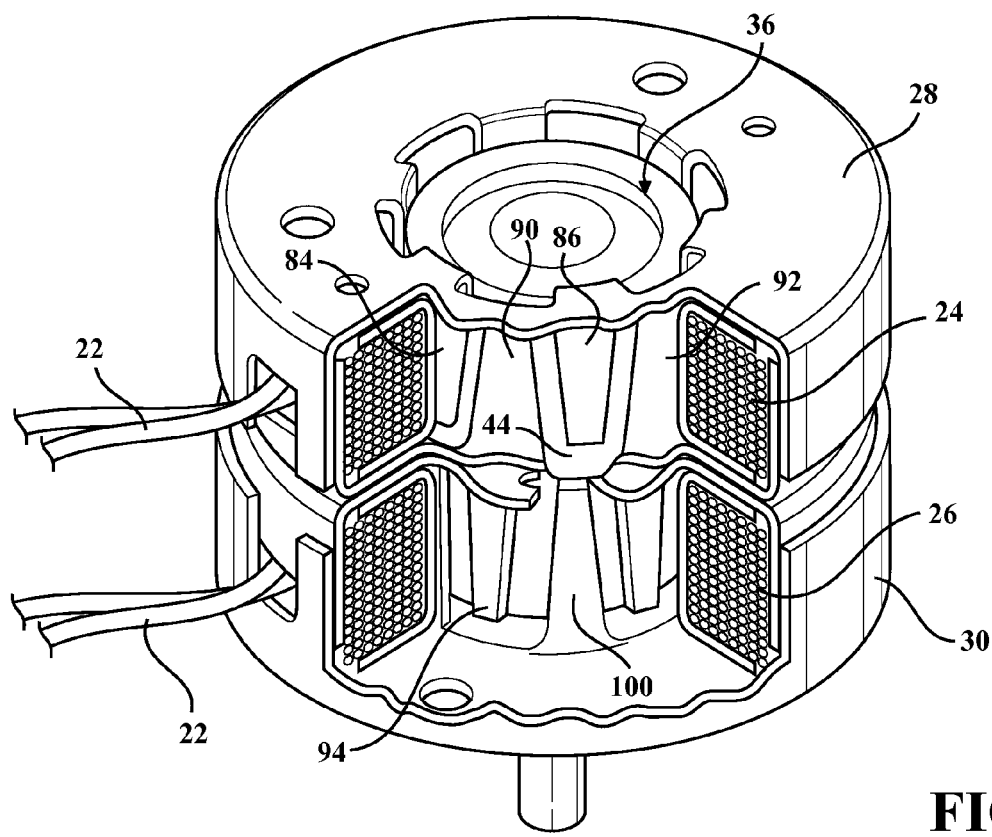
FIG. 3A is a partial sectional view of a portion of a digital linear actuator having a rotor which includes a magnet and the flux density and run out of the magnet are measured, according to the present invention.
Figure 3B:
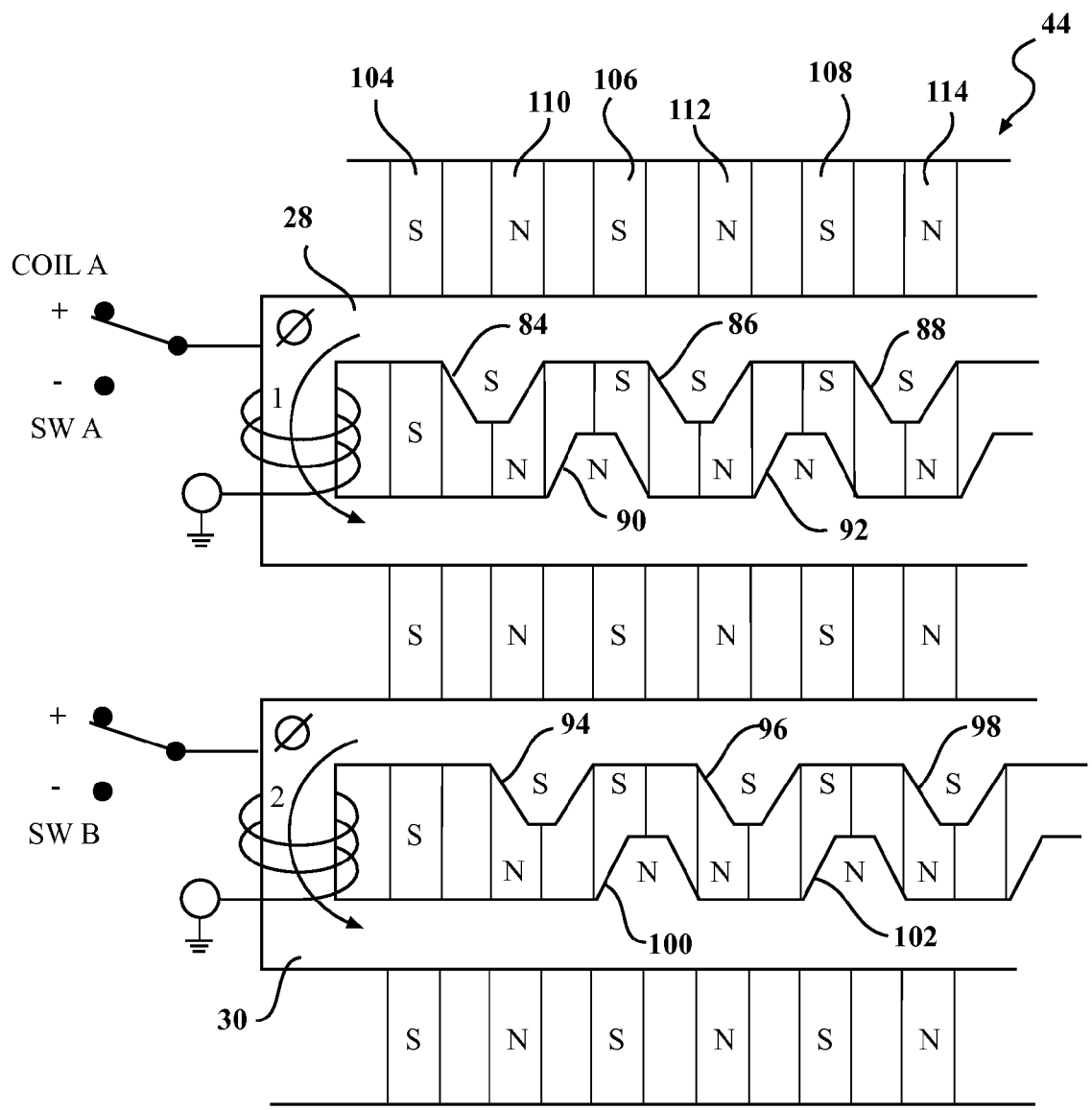
FIG. 3B is a pictogram of a radial surface of a magnet and portions of a first stator assembly and a second stator assembly, where the flux density and run out of the magnet are centrally measured, according to the present invention.

The cylindrical magnet 44 includes a plurality of alternating pole pairs, which extend along the length of the magnet 44. More specifically, the cylindrical magnet 44 includes at least a first south pole 104, a second south pole 106, and a third south pole 108. The magnet 44 also includes at least a first north pole 110, a second north pole 112, and a third north pole 114. While three south poles 104,106,108 and three north poles 110,112,114 are shown in FIG. 3B, FIG. 3B is only a partial view of the magnet 44, and there are actually six north poles and six south poles, for a total of twelve poles, which creates six pole pairs. It is also within the scope of the invention that more or less poles may be used, depending upon the size of the magnet 44, and the application. The number of pole pairs affects the step increment of the magnet 44. In this embodiment, since one full rotation of the magnet is 360°, and there are twelve pole teeth per stator, the stator assembly step increment is 30°. However, since the two stator assemblies 28,30 are radial offset by half of the pole tooth distance, the stepper motor step increment 15°. In other embodiments, such as the magnet 44 having 10 pole pairs, the step increment would be 9°. In yet another alternate embodiment, the magnet 44 includes two pole pairs, creating a step increment of 45°. In other embodiments of the invention, more or less pole pairs may be used to create the desired step increment.

The cylindrical rotor 36 rotates about an axis, and the rotor 36 used in stepper motors is magnetized longitudinally along the axis. Magnetization of the rotor 36 is achieved using a multiple N-S pole pair configuration, such as the configuration of the north poles 110,112,114 and south poles 104,106, 108 shown in FIG. 3B. Spacing and quantity of the pole pairs are motor step angle dependant, as mentioned above. The DLA 10 has two coil fields (shown as the two coils 24,26 in FIGS. 2A and 3A) which are stacked along the length of the rotor 36. A central median bisecting plane is targeted for gauss analysis in the area of each coil 24,26.

In operation, current is transferred through the terminals 20, and then through the wires 22 to each of the coils 24,26. The current in the coils 24,26 creates an electromagnetic field in the field cup teeth 84,86,88,100,102 and the pole plate teeth 90,92,94,96,98 of each of the stator assemblies 28,30. This electromagnetic field also interacts with the poles 104,106, 108,110,112,114 of the magnet 44, causing the magnet 44, and therefore the rotor 36 to rotate into the nearest phase magnetic balance.

As mentioned above, the connection between the guide aperture 60 and the enlarge diameter portion 64 of the actuation shaft 62 prevents the actuation shaft 62 from rotating. The rotation of the threaded portion 68 of the rotor 36 relative to the threaded portion 66 of the actuation shaft 62 translates the rotational motion of the rotor 36 to linear motion of the actuation shaft 62. The connection between the threaded portion 68 of the rotor 36 and the threaded portion 66 of the actuation shaft 62 moves the actuation shaft 62 linearly as the rotor 36 is rotated.

The movement of the actuation shaft 62 linearly moves the first portion 78 of the valve, and extends the first portion 78 away from the front bearing housing 54 when the rotor 36 is rotated in a first direction, or counter clockwise direction. When the current is applied to one of the coils, such as the first coil 24, is reversed, the electromagnetic field in the field cup teeth 84,86,88 and the pole plate teeth 90,92 of the stator assembly 28 is reversed, causing the magnet 44 and therefore the rotor 36 to rotate in the opposite or retract direction, which in this embodiment is a second direction, or clockwise direction. This again causes the actuation shaft 62 to move linearly, and the first portion 78 of the valve moves toward the front bearing housing 54 when the rotor 36 is rotated in the clockwise direction.

The operation of the DLA 10 is affected by the electromagnetic field generated in the coils 24,26 and the teeth 84,86,88, 90,92,94,96,98,100,102. The operation of the DLA 10 is also affected by the flux density of the magnet 44. During the design of the DLA 10, the flux density of the magnet 44 is measured, as well as the run out on the surface of the magnet 44. The magnet 44 has a length 148, and the run out is measured at a first section 118, which is a planar circumference located at a distance away from an end 118A of thirty percent of the length 148 of the magnet 44, and a second section 116, which is also a planar circumference located at a distance away from another end 116A of thirty percent of the length 148 of the magnet 44, shown in FIG. 2B. More specifically, the flux density is measured along a radial location that is away from each end 116A,118A, which in this embodiment, is a distance of thirty percent of the overall length of the magnet 44 inboard from the first end 116A, and a distance of thirty percent of the overall length of the magnet 44 inboard from the second end 118A. The measurement is essentially taken along a central median bisecting plane of the stator assemblies 28,30, and each central median bisecting plane is located at the first section 118 and the second section 116.

Measurement of the flux density is accomplished by rotating the rotor 36 and measuring the magnetic field strength variation between neighboring poles 104,100,106,112,108, 114, at a defined radial "air gap" distance. The flux density is measured by a gauss probe, and the air gap is a predetermined radial distance away from the outer surface of the rotor 36. In one embodiment, the air gap is about 0.010 inches in radial distance; however, it is within the scope of the invention that other radial distances may be used to obtain the measured flux density. The Gauss measurement of the magnetic flux is specific to the air gap. This radial distance corresponds physically to the DLA internal "air gap" between rotor 36 and the teeth 84,86,88,90,92,94,96,98,100,102 of the stator assemblies 28,30. The magnetic flux exits the north poles 110,112, 114 and enters in the south poles 104,106,108. Stray flux field or Gauss eddy current losses originate from the ends of the cylindrical magnet 44. The radial Gauss at the ends of the rotor 36 are influenced by eddy current loss. Gauss measurements are therefore not performed too close to the rotor cylinder ends.

Additionally, the circular runout is measured by the use of a non-contact measurement sensor. The surface of the rotor 36, and more specifically, the magnet 44, is measured to establish the magnitude of variation. Significant variation of the surface of the magnet 44, such as circular run out, may influence the flux density reading as the dimension of the radial air gap changes. The measurement of the surface of the magnet 44 is not only used to evaluate the planar circular run out of the magnet 44 relative to the core axis, but also any bearing journal surfaces, such as the surface 52A of the outer portion 52, shown in FIG. 2B. In an alternate embodiment, an axial fixture may be used to position the non-contact measurement sensor to measure the total runout of the surface of the rotor 36, and not just a circular runout measurement of a planar section.

Figure 4:
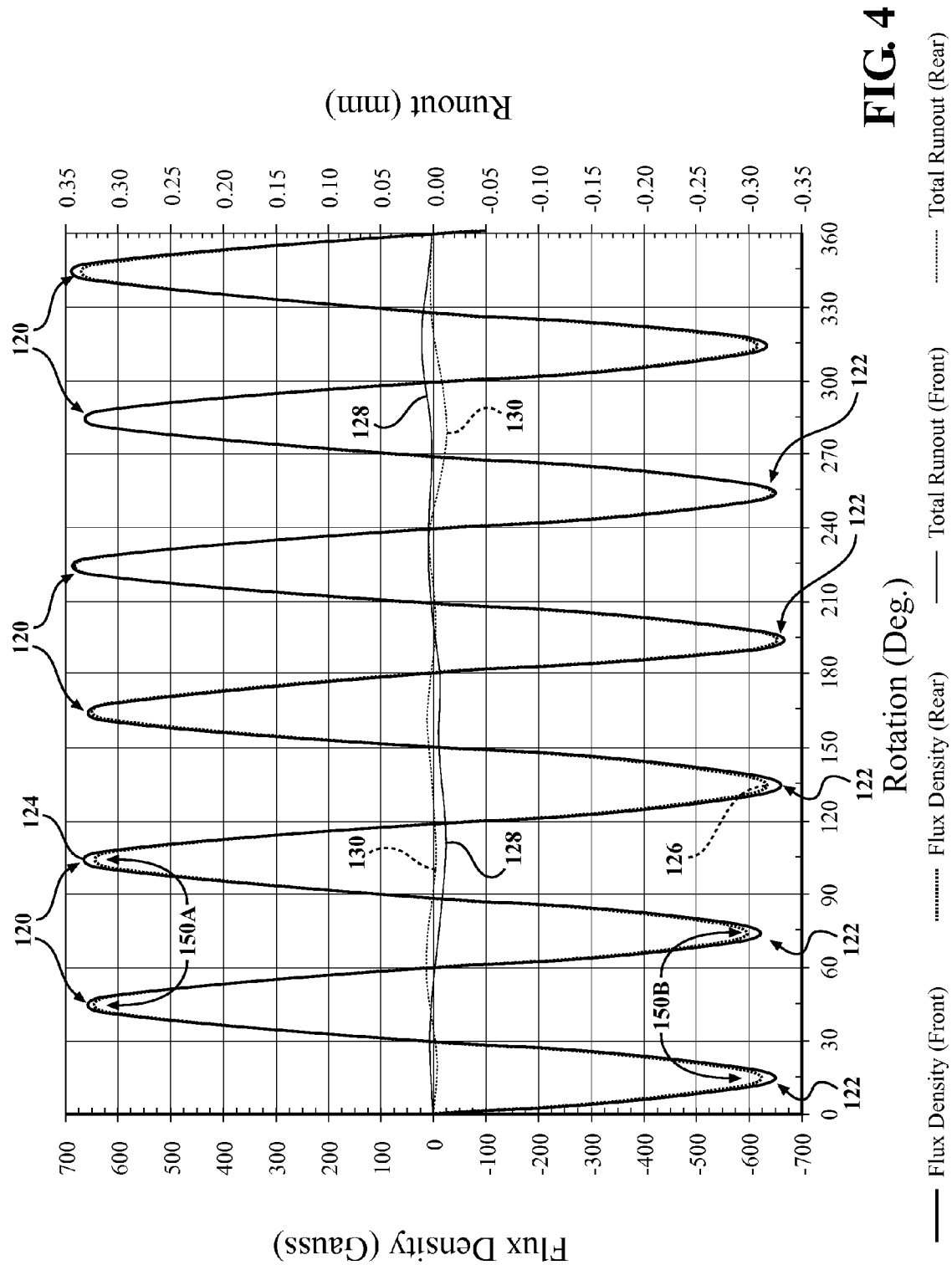
FIG. 4 is a plot having flux density measurements and run out measurements, according to the present invention.

The method of the present invention incorporates simultaneously plotting the flux density reading (as a sine wave plot) and the run out variation during one full revolution. In one embodiment, a plot according to the present invention is shown in FIG. 4. The flux density and run out are plotted together to provide a correlation between surface variation, and variation in flux density. There is a plurality of peaks 120 and a plurality of valleys 122. The peaks 120 represent the maximum flux density of each of the north poles 110,112, 114, and the valleys 122 represent the maximum flux density at each of the south poles 104,106,108. There are two plots which show the measured flux density in FIG. 4, a first line 124 representing the flux density measured in the first section 118, and a second line 126 representing the flux density measured in the second section 116. Furthermore, there is a third line 128 representing the run out measured in the first section 118, and a fourth line 130 representing the run out measured in the second section 116.

The overlay of the flux density and run out shows a correlation between the variations in the surface of the magnet 44 and the measured flux density.

Figure 5:
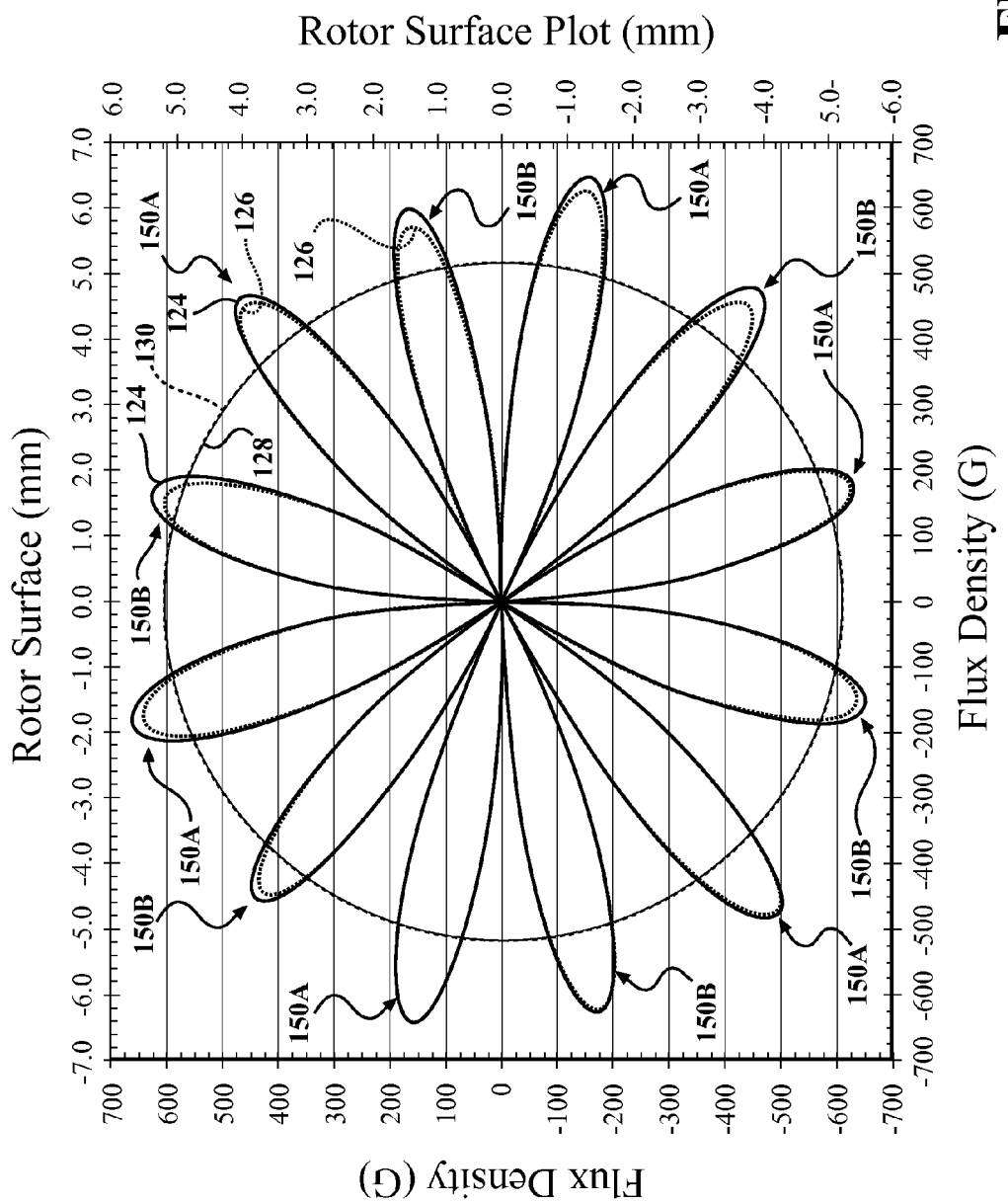
FIG. 5 is a radar plot having flux density measurements and run out measurements, according to the present invention.

In another embodiment, instead of plotting the flux density as a sine wave plot, and overlaying the run out plot with the flux density plot, as shown in FIG. 4, the flux density may be plotted as a polar graph, or radar plot, as shown in FIG. 5. Instead of having a plurality of peaks 120 and valleys 122, FIG. 5 includes a plurality of "petals." Each petal 150 provides an indication of one of the magnet poles 104,110,106, 112,108,114 along a radial indexed location of the magnet 44.

These geometric shapes, or petals 150, are magnetic flux gauss measurements that software visualizes into absolute vector radar plots. The radar plot in FIG. 5 is a pictorial which presents the data in an efficient manner. The radar plots are derived from the magnetic flux gauss measurement at the radial air gap from around the outer surface of the magnet 44 of the rotor 36. The magnetic flux field gauss values are recorded as a sine wave as the test part is rotated during measurement. The magnetic flux field gauss strength determines plot amplitude. The magnetic flux field gauss polarity is determined by rotor magnetization (north and south). The sine wave that is a recorded is plotted as shown in FIG. 4 to represent the measurement of the flux density. However, in FIG. 5, the positive and negative polarity sine waves create "lemniscates" shapes in the radar plot. As this creates a confusing image, the sine wave is translated into absolute values. In the resulting radar plot shown in FIG. 5, each petal 150 visually represents the neighboring pole (i.e. north, south, and north) which is easier to relate to the physical magnet 44 of the rotor 36. Each "petal" 150 represents a single magnetic pole.

In FIG. 5, the plots of the run out measurements are also plotted along a radial indexed location, correlating to the location of the flux density. Each value on the plot shown in FIG. 5 is represented as a vector distance from the origin centre of the plot. Values are plotted corresponding to the index position during measurement rotation of the rotor 36.

More specifically, the flux density measured in the first section 118 is shown by the first line 124, and the flux density measured in the second section 116 is shown by the second line 126. The first line 124 and the second line 126 shown in FIG. 5 represent the same flux density as shown by the lines 124,126 in FIG. 4, with the difference being how the flux density is plotted. Additionally, each petal 150 also represents the alternating north and south poles on the magnet 44, and are plotted in magnetic sector increments of thirty degrees, beginning at zero degrees, and the pole peak is observed at fifteen degrees. In this embodiment, since there are six pole pairs, or twelve poles, and one rotation of the rotor 36 is 360°, the plotted magnetic sector increments are thirty degrees. More specifically, the north poles are shown generally at 150A, and the south poles are shown generally at 150B. The petal 150B representing the flux density measurement for the first south pole 104 is located at fifteen degrees, the petal 150A representing the flux density measurement for the first north pole 110 is located at forty-five degrees, the petal 150B representing the flux density measurement for the second south pole 106 is located at seventy-five degrees, and the petal 150A representing the flux density measurement for the second north pole 112 is located at one-hundred-five degrees, and this pattern continues as shown in FIG. 5, and all of the petals 150 are plotted. Since there are six pole pairs, there are twelve petals 150 plotted. As mentioned above, while there are only three south poles 104,106,108 and three north poles 110,112,114 shown in FIG. 3B, there are actually six north poles and six south poles. In this embodiment, plots are shown representing the flux density for the six south poles and the six north poles of the magnet 44 in an alternating manner, but it is within the scope of the invention that more or less pole pairs may be included as part of the magnet 44.

Also shown in FIG. 5 is the radial plot of the run out, shown by the third line 128 and the fourth line 130. These lines 128,130 are the same lines 128,130 as shown in FIG. 4, but are plotted radially, and form two circles. It can be seen in FIG. 5 that the measurement of the run out along the outer surface of the magnet 44 corresponds to the measurements of the flux density taken at the same location along the outer surface of the magnet 44. The plot in FIG. 5 provides a correlation between the measured magnetic flux density and the run out variation at corresponding locations on the surface of the magnet 44. This provides information that may be used during the development of the rotor 36, such that the surface finish of the magnet 44 may be changed to reduce or eliminate run out, and provide a consistent air gap and the desired magnetic flux density.

When looking at FIG. 5, and the two circles formed by the third line 128 and the fourth line 130, these two circles (the third line 128 representing the run out measured in the first section 118, and the fourth line representing the run out measured in the second section 116) are visualized surface plots of the cylindrical magnet 44 which is part of the rotor 36, and represent circular run out. Ideally, the two circles constructed by the third line 128 and the fourth line 130 form overlapping circles having a consistent radius. However, when looking at the plot shown in FIG. 5, if the two circles (created by the lines 128,130) do not overlap, it is an indicator that the cylindrical shape of the magnet 44 is inconsistent. When one circle plot is observed inside the other circle plot (the circle created by line 128 is inside of the circle created by line 130, or vice versa), it would be indicative of the rotor magnet 44 having a conical feature, or being conically shaped. When the circle plots created by the lines 128,130 are observed such that the two lines 128,130 separate for an arc segment it is an indication that the shape of the surface of the magnet 44 is inconsistent along an axial length.

Each "petal" 150 represents a pole on the magnet rotor (and is a portion of the first line 124 and the second line 126). The vector magnitude of each petal 150 represents the magnetic flux gauss field strength. The vector distance each petal 150 extends from the origin center can be interpreted as the strength of the magnet (a bigger petal means a stronger Gauss measurement). Differences in the size of the petals 150, amplitude and width, indicates a variation of the Gauss magnet field strength. If the two petal plot groups (the first group of petals 150 created by the first line 124 representing the flux density measured in the first section 118, and the second group of petals 150 created by the second line 126 representing the flux density measured in the second section 116) do not overlap, it is an indicator that magnetization is inconsistent.

However, assuming magnet uniformity and homogeneity, variation between the amplitudes of one pair of petals 150 indicates material variation in the magnet 44 or surface imperfection on the surface of the magnet 44. Imperfections on the surface of the magnet 44 are usually limited to variation of a single petal 150. Cross checking against the rotor surface plot variation would confirm this surface variation.

Variation between the amplitudes can indicate magnetic flux gauss field strength changing along the length of the rotor. More specifically, if the plot of one petal 150 is observed fully inside the other another petal 150, it would be indicative of a field strength variation along the length of the magnet 44 of the rotor 36. Cross checking against the rotor surface plot variation would confirm any surface imperfections, causing air gap variation in Gauss measurements.

If the group of petals 150 created by the first line 124 is observed fully inside the group of petals 150 created by the second line 126, or vice versa, this indicates a field strength variation along the length of the magnet 44 of the rotor 36. Cross checking against any plot variation shown by the third line 128 and the fourth line 130 would confirm a conical outer surface of the magnet 44.

If both the group of petals 150 created by the first line 124 and the group of petals 150 created by the second line 126 appear to be shifted in only one vector direction, this indicates a field strength variation along the length of the magnet 44. Cross checking against any plot variation shown by the third line 128 and the fourth line 130 would confirm rotor center misalignment during the magnetization process.

If both the group of petals 150 created by the first line 124 and the group of petals 150 created by the second line 126 appear to have an angular phase shift, this indicates a non-axial askew magnetization or axial misalignment during the magnetization process. Cross checking against any plot variation shown by the third line 128 and the fourth line 130 would confirm a defect with the magnetization equipment process.

Figure 6:
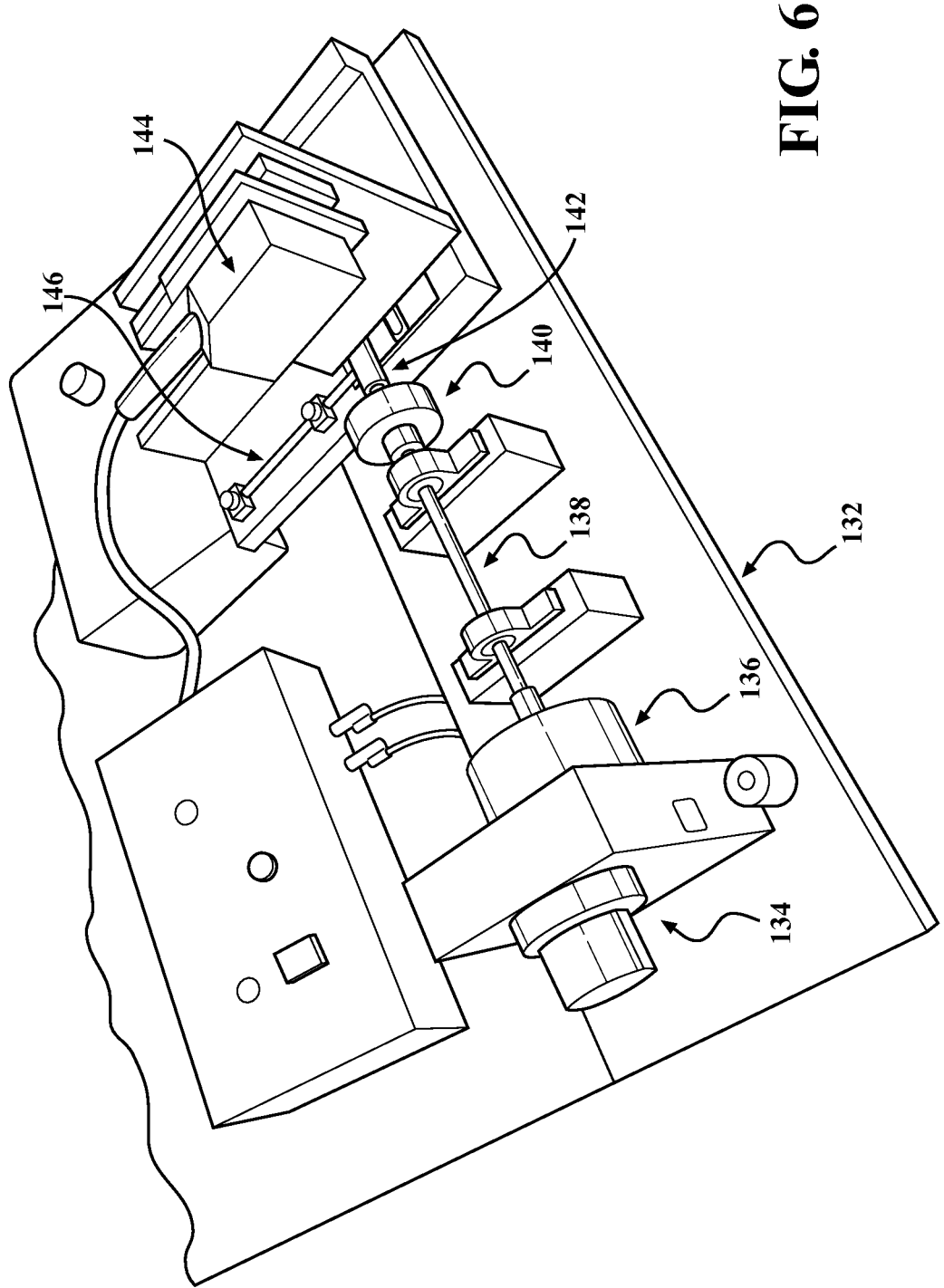
FIG. 6 is a perspective view of a tool used to measure the flux density and run out of a rotor, according to the present invention.

Referring to FIG. 6, an example of a tool, shown generally at 132 used for measuring flux density and run out is shown. The tool 132 includes an indexing rotary head, shown generally at 134, which is connected to an angular encoder, shown generally at 136, and the angular encoder 136 is connected to a shaft, shown generally at 138. The shaft 138 is connected to a fixture, shown generally at 140, which in this embodiment is a collet axial fixture 140, and the rotor 36 is mounted in the fixture 140. The rotor 36 is shown as a test specimen, shown generally at 142 in FIG. 6. The tool 132 also includes an adjustable non-contact measurement sensor, shown generally at 144, and an adjustable gauss probe, shown generally at 146. In this embodiment, the non-contact measurement sensor 144 is a laser probe, but it is within the scope of the invention that other types of non-contact measurement sensors may be used.

In operation, the indexing rotary head 134 rotates and drives the shaft 138 and the test specimen 142 located in the fixture 140. As the shaft 138 rotates, the angular encoder 136 measures the angular position of the shaft 138. As the test specimen 142 is rotated, the non-contact measurement sensor 144 measures the surface run out on the surface of the magnet 44, and the gauss probe 146 measures the flux density. Measurement of the flux density and surface run out cannot be performed simultaneous at the same point. Therefore, the measurements are performed ninety degrees apart, as shown in FIG. 6, and software compensates for the different radial locations in measurement. Plots the data such that the magnetic flux and run out are correlated, as shown in FIG. 5. Although in this embodiment the measurements are performed ninety degrees apart, it is within the scope of the invention that measurements may be taken in other locations as well.

In an alternate embodiment, the measurements of flux density and run out may be incorporated into a production process to measure production rotors 36, and provide a correlation between run out and flux density, such that any variation may be compensated for during assembly of the DLA 10.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for measuring the magnetic flux and run out of a surface, comprising the steps of:
    providing a digital linear actuator (DLA);
    providing a rotor, the rotor being part of the DLA;
    providing a magnet connected to and circumscribing the rotor, the magnet having an outer surface;
    providing a plot having the magnet flux density of the magnet, and the run out of the magnet;
    providing a first section of the outer surface wherein the first section to be a first central median bisecting plane located on the outer surface of the rotor;
    providing a second section of the outer surface, the second section to be a second central median bisecting plane located on the outer surface of the rotor, wherein the second section to be at the opposite end of the magnet as the first section;
    providing a non-contact measurement sensor for measuring the run out on the first section of the outer surface of the magnet, and for measuring the run out on the second section of the outer surface of the magnet;
    providing a gauss probe for measuring the magnet flux density generated in proximity to the first section of the outer surface of the magnet, and for measuring the magnet flux density generated in the second section of the outer surface of the magnet;
    simultaneously measuring the run out and the magnet flux density of the rotor;
    plotting the run out and the magnet flux density are together on the plot to correlate the measurements of the run out and the magnet flux density;
    measuring the magnet flux density in the first section and in the second section using the gauss probe;
    measuring the run out in the first section and in the second section using the non-contact measurement sensor;
    plotting the magnet flux density measured in the first section and in the second section on the plot; and
    plotting the run out measured in the first section and the second section on the plot.

2. The method for measuring the magnetic flux and run out of a surface of claim 1, further comprising:
    providing the first section to be a first central median bisecting plane located on the outer surface of the magnet;
    providing the second section to be a second central median bisecting plane located on the outer surface of the magnet, such that the second section is different from the first section;
    measuring the magnet flux density in the first section and the second section; and
    measuring the run out in the first section and the second section.

3. The method for measuring the magnetic flux and run out of a surface of claim 1, further comprising the steps of providing the plot to be a radar plot.

4. The method for measuring the magnetic flux and run out of a surface, of claim 3, further comprising the steps of:
    providing a plurality of petals to be formed as part of the radar plot, each of the plurality of petals including a portion of the first flux density plot and a portion of the second flux density plot; and
    providing a portion of the plurality of petals represents one or more north poles, and a portion of the plurality of petals represents one or more south poles.

5. The method for measuring the magnetic flux and run out of a surface of claim 1, further comprising the steps of:
providing a first flux density plot, indicating the magnetic flux density measured from the first section;
providing a first run out plot, indicating the run out measured from the first section;
providing a second flux density plot, indicating the magnetic flux density measured from the second section;
providing a second run out plot, indicating the run out measured from the second section; and
plotting the first flux density plot, the second flux density plot, the first run out plot, and the second run out plot such that a correlation is made between the flux density of the magnet and the run out of the magnet.

6. The method for measuring the magnetic flux and run out of a surface, of claim 1, further comprising the steps of providing a tool for measuring the magnetic flux and the run out, the gauss probe and the non-contact measurement sensor being part of the tool.

7. The method for measuring the magnetic flux and run out of a surface, of claim 6, further comprising the steps of:
providing an indexing rotary head, the indexing rotary head being part of the tool;
providing an angular encoder connected to the indexing rotary head;
providing a shaft connected to the indexing rotary head;
providing a fixture connected to the shaft;
mounting the rotor in the fixture;
rotating the indexing rotary head such that rotational force is transferred through the angular encoder, rotating the shaft, the fixture, and the rotor;
measuring the angular position of the shaft with the angular encoder;
measuring the flux density of the rotor using the gauss probe as the rotor is rotated in the fixture; and
measuring the run out using the non-contact measurement sensor as the rotor is rotated in the fixture.

8. A method for measuring the magnetic flux and run out of a surface, comprising the steps of:
providing a digital linear actuator (DLA);
providing a rotor, the rotor being part of the DLA;
providing a magnet connected to and circumscribing the rotor, the magnet having an outer surface;
providing a non-contact measurement sensor for measuring the run out on the outer surface of the magnet;
providing a gauss probe for measuring the magnet flux density on the outer surface of the magnet;
providing a first section on the outer surface;
providing a second section on the outer surface;
measuring the run out along the first section of the outer surface, and the second section of the outer surface;
providing the first section to be a first central median bisecting plane located on the outer surface of the rotor;
providing the second section to be a second central median bisecting plane located on the outer surface of the rotor, wherein the second section to be at the opposite end of the magnet as the first section;
providing the plot to be a radar plot;
providing a first flux density plot, indicating the magnetic flux density measured from the first section;
providing a first run out plot, indicating the run out measured from the first section;
providing a second flux density plot, indicating the magnetic flux density measured from the second section;
providing a second run out plot, indicating the run out measured from the second section;
simultaneously measuring the run out and the magnet flux density;
plotting the run out and the magnet flux density on a plot to correlate the measurements of the run out and the magnet flux density;
plotting the first flux density plot and the second flux density plot to form at least a portion of the radar plot; and
plotting the first run out plot and the second run out plot with the first flux density plot and the second flux density plot, such that a correlation is made between variations in run out measurements and flux density measurements.

9. The method for measuring the magnetic flux and run out of a surface of claim 8, further comprising the steps of:
providing a tool for measuring the magnetic flux and the run out, the gauss probe and the non-contact measurement sensor being part of the tool;
providing an indexing rotary head, the indexing rotary head being part of the tool;
providing an angular encoder connected to the indexing rotary head;
providing a shaft connected to the angular encoder;
providing a fixture connected to the shaft;
mounting the rotor in the fixture;
rotating the indexing rotary head such that rotational force is transferred through the angular encoder, rotating the shaft, the fixture, and the rotor;
measuring the angular position of the shaft with the angular encoder;
measuring the flux density of the rotor using the gauss probe as the rotor is rotated in the fixture; and
measuring the run out using the non-contact measurement sensor as the rotor is rotated in the fixture.

10. The method for measuring the magnetic flux and run out of a surface of claim 8, further comprising the steps of:
providing a plurality of petals to be formed as part of the radar plot, each of the plurality of petals including a portion of the first flux density plot and a portion of the second flux density plot; and
providing a portion of the plurality of petals represents one or more north poles, and a portion of the plurality of petals represents one or more south poles;
plotting the first run out plot and the second run out plot on the radar plot to provide a correlation between the run out and the flux density of the one or more north poles and the one or more south poles.

11. A scan tool for measuring the magnetic flux and run out of a surface, comprising:
a rotor;
a magnet connected to and circumscribing the rotor, the magnet having an outer surface;
a first section being part of the outer surface, the first section being a first central median bisecting plane located on the outer surface of the rotor;
a second section being part of the outer surface, the second section being a second central median bisecting plane located on the outer surface of the rotor, wherein the second section to be at the opposite end of the magnet as the first section;
an indexing rotary head;
a shaft connected to and driven by the indexing rotary head;
an angular encoder for measuring the angular rotation of the shaft;
a fixture connected to and driven by the shaft, a rotor selectively mounted in the fixture;
a non-contact measurement sensor for measuring the run out on the rotor;

a gauss probe for measuring the flux density of the rotor; and a plot showing the measurements of the run out of the magnet and the flux density of the magnet;

a first flux density plot, indicating the magnetic flux density measured from the first section;

a first run out plot, indicating the run out measured from the first section;

a second flux density plot, indicating the magnetic flux density measured from the second section; and a second run out plot, indicating the run out measured from the second section;

wherein the first flux density plot, the second flux density plot, first run out plot, and the second run out plot are plotted together on the plot;

wherein the non-contact measurement sensor measures the run out at the first section on the outer surface, and the second section on the outer surface, and the gauss probe simultaneously measures flux density on the first section of the outer surface, and the second section on the outer surface.

12. The scan tool for measuring the magnetic flux and run out of a surface of claim 11, wherein the plot is a radar plot having a plurality of petals.

13. The scan tool for measuring the magnetic flux and run out of a surface of claim 12, the plurality of petals further comprised of the first flux density plot and the second flux density plot, and a portion of the plurality of petals represent the flux density of the plurality of north poles of the magnet, and a portion of the petals representing the flux density of the plurality of south poles of the magnet.

* * * * *